(12) United States Patent
Lin

(10) Patent No.: US 6,528,891 B2
(45) Date of Patent: Mar. 4, 2003

(54) BUMPLESS FLIP CHIP ASSEMBLY WITH SOLDER VIA

(76) Inventor: Charles Wen Chyang Lin, 55 Cairnhill Road, #21-04 Cairnhill Plaza, Singapore, 229666 (SG)

( * ) Notice: Subject to any disclaimer, the term of this patent is extended or adjusted under 35 U.S.C. 154(b) by 0 days.

(21) Appl. No.: 09/852,821

(22) Filed: May 10, 2001

(65) Prior Publication Data

US 2002/0125581 A1 Sep. 12, 2002

Related U.S. Application Data

(62) Division of application No. 09/465,024, filed on Dec. 16, 1999.

(30) Foreign Application Priority Data

Dec. 17, 1998 (SG) .......................................... 9804817-6

(51) Int. Cl.[7] .............................................. H01L 23/48
(52) U.S. Cl. ................. 257/778; 257/666; 257/668; 257/737; 257/738; 257/772; 257/774; 257/779; 257/780; 257/781
(58) Field of Search ................................ 257/666, 668, 257/772, 774, 778, 779, 698, 780, 781, 737, 738

(56) References Cited

U.S. PATENT DOCUMENTS

| | | | | |
|---|---|---|---|---|
| 3,577,037 A | * | 5/1971 | Di Pietro | 317/101 |
| 4,074,342 A | * | 2/1978 | Honn et al. | 361/411 |
| 4,955,523 A | | 9/1990 | Calomagno et al. | 228/179 |
| 4,970,571 A | | 11/1990 | Yamakawa et al. | 357/71 |
| 4,984,358 A | | 1/1991 | Nelson | 29/830 |
| 5,074,947 A | | 12/1991 | Estes et al. | 156/307.3 |
| 5,106,461 A | | 4/1992 | Volfson et al. | 205/125 |
| 5,116,463 A | | 5/1992 | Lin et al. | 156/653 |
| 5,137,845 A | | 8/1992 | Lochon et al. | 437/183 |
| 5,167,992 A | | 12/1992 | Lin et al. | 427/437 |
| 5,196,371 A | | 3/1993 | Kulesza et al. | 437/183 |
| 5,209,817 A | | 5/1993 | Ahmad et al. | 156/643 |
| 5,237,130 A | | 8/1993 | Kulesza et al. | 174/260 |
| 5,260,234 A | | 11/1993 | Long | 437/203 |
| 5,261,593 A | | 11/1993 | Casson et al. | 228/180.22 |
| 5,275,330 A | | 1/1994 | Issacs et al. | 228/180.2 |

(List continued on next page.)

FOREIGN PATENT DOCUMENTS

| | | | | |
|---|---|---|---|---|
| EP | 0 718 882 A1 | 6/1996 | ......... | H01L/23/057 |
| WO | WO 97/38563 | 10/1997 | ............ | H05K/1/03 |
| WO | WO 99/57762 | 11/1999 | ........... | H01L/23/48 |

OTHER PUBLICATIONS

Markstein et al., "Controlling the Variables in Stencil Printing," Electronic Packaging & Production, Feb. 1997, pp. 48–56.

(List continued on next page.)

Primary Examiner—George Eckert
Assistant Examiner—Edgardo Ortiz
(74) Attorney, Agent, or Firm—David M. Sigmond

(57) ABSTRACT

A flip chip assembly, and methods of forming the same, including a single or multi-layer substrate having a plurality of via holes which serve as the connection between the semiconductor device and substrate circuitry. The method of manufacturing the flip chip assembly includes the steps of attaching an integrated circuit (IC) chip having a plurality of input/output terminal pads to a rigid or flexible substrate having a plurality of via holes. The via holes are aligned with the terminal pads so that the respective traces on the substrate can be connected to the respective terminal pads through the via holes. After attachment, the pre-deposited solder inside the via holes or on the terminal pads is re-flowed. This re-flow soldering process electrically connects the IC chip to the substrate. The solder can be deposited by plating, wave soldering, meniscus coating, and screen printing techniques.

40 Claims, 4 Drawing Sheets

U.S. PATENT DOCUMENTS

| | | | |
|---|---|---|---|
| 5,284,796 A | 2/1994 | Nakanishi et al. | 437/183 |
| 5,293,067 A | 3/1994 | Thompson et al. | 257/668 |
| 5,327,010 A | 7/1994 | Uenaka et al. | 257/679 |
| 5,334,804 A | 8/1994 | Love et al. | 174/267 |
| 5,346,750 A | 9/1994 | Hatakeyama et al. | 428/209 |
| 5,355,283 A | 10/1994 | Marrs et al. | 361/760 |
| 5,358,621 A | 10/1994 | Oyama | 205/123 |
| 5,397,921 A | 3/1995 | Karnezos | 257/779 |
| 5,407,864 A | 4/1995 | Kim | 437/203 |
| 5,424,245 A | 6/1995 | Gurtler et al. | 437/183 |
| 5,438,477 A | 8/1995 | Pasch | 361/689 |
| 5,439,162 A | 8/1995 | George et al. | 228/180.22 |
| 5,447,886 A | 9/1995 | Rai | 437/183 |
| 5,454,161 A | 10/1995 | Beilin et al. | 29/852 |
| 5,454,928 A | 10/1995 | Rogers et al. | 205/125 |
| 5,475,236 A | 12/1995 | Yoshizaki | 257/48 |
| 5,477,933 A | 12/1995 | Nguyen | 174/262 |
| 5,478,007 A | 12/1995 | Marrs | 228/180.22 |
| 5,483,421 A | 1/1996 | Gedney et al. | 361/771 |
| 5,484,647 A | 1/1996 | Nakatani et al. | 428/209 |
| 5,487,218 A | 1/1996 | Bhatt et al. | 29/852 |
| 5,489,804 A | 2/1996 | Pasch | 257/778 |
| 5,493,096 A | 2/1996 | Koh | 219/121.71 |
| 5,508,229 A | 4/1996 | Baker | 437/183 |
| 5,525,065 A | 6/1996 | Sobhani | 439/67 |
| 5,536,973 A | 7/1996 | Yamaji | 257/737 |
| 5,542,601 A | 8/1996 | Fallon et al. | 228/119 |
| 5,547,740 A | 8/1996 | Higdon et al. | 428/209 |
| 5,556,810 A | 9/1996 | Fujitsu | 437/209 |
| 5,556,814 A | 9/1996 | Inoue et al. | 437/230 |
| 5,564,181 A | 10/1996 | Dineen et al. | 29/841 |
| 5,572,069 A | 11/1996 | Schneider | 257/690 |
| 5,576,052 A | 11/1996 | Arledge et al. | 427/98 |
| 5,583,073 A | 12/1996 | Lin et al. | 439/183 |
| 5,595,943 A | 1/1997 | Itabashi et al. | 437/230 |
| 5,599,744 A | 2/1997 | Koh et al. | 437/195 |
| 5,611,140 A | 3/1997 | Kulesza et al. | 29/832 |
| 5,611,884 A | 3/1997 | Bearinger et al. | 156/325 |
| 5,613,296 A | 3/1997 | Kurino et al. | 29/852 |
| 5,614,114 A | 3/1997 | Owen | 219/121.66 |
| 5,615,477 A | 4/1997 | Sweitzer | 29/840 |
| 5,619,791 A | 4/1997 | Lambrecht, Jr. et al. | 29/852 |
| 5,627,405 A | 5/1997 | Chillara | 257/668 |
| 5,627,406 A | 5/1997 | Pace | 257/700 |
| 5,633,204 A | 5/1997 | Tago et al. | 438/614 |
| 5,637,920 A | 6/1997 | Loo | 257/700 |
| 5,641,113 A | 6/1997 | Somaki et al. | 228/180.22 |
| 5,645,628 A | 7/1997 | Endo et al. | 106/1.23 |
| 5,646,067 A | 7/1997 | Gaul | 437/180 |
| 5,648,686 A | 7/1997 | Hirano et al. | 257/778 |
| 5,654,584 A | 8/1997 | Fujitsu | 257/666 |
| 5,656,858 A | 8/1997 | Kondo et al. | 257/737 |
| 5,663,598 A | 9/1997 | Lake et al. | 257/737 |
| 5,665,652 A | 9/1997 | Shimizu | 438/127 |
| 5,666,008 A | 9/1997 | Tomita et al. | 257/778 |
| 5,669,545 A | 9/1997 | Pham et al. | 228/1.1 |
| 5,674,785 A | 10/1997 | Akram et al. | 437/217 |
| 5,674,787 A | 10/1997 | Zhao et al. | 437/230 |
| 5,682,061 A | 10/1997 | Khandros et al. | 257/666 |
| 5,691,041 A | 11/1997 | Frankeny et al. | 428/209 |
| 5,722,162 A | 3/1998 | Chou et al. | 29/852 |
| 5,723,369 A | 3/1998 | Barber | 438/106 |
| 5,731,223 A | 3/1998 | Padmanabhan | 437/183 |
| 5,736,456 A | 4/1998 | Akram | 438/614 |
| 5,739,585 A | 4/1998 | Akram et al. | 257/698 |
| 5,744,859 A | 4/1998 | Ouchida | 257/668 |
| 5,757,071 A | 5/1998 | Bhansali | 257/697 |
| 5,757,081 A | 5/1998 | Chang et al. | 257/778 |
| 5,764,486 A | 6/1998 | Pendse | 361/774 |
| 5,769,163 A * | 6/1998 | Glenn et al. | 257/698 |
| 5,774,340 A | 6/1998 | Chang et al. | 361/771 |
| 5,789,271 A | 8/1998 | Akram | 438/18 |
| 5,798,285 A | 8/1998 | Bentlage et al. | 438/108 |
| 5,801,072 A | 9/1998 | Barber | 438/107 |
| 5,801,447 A | 9/1998 | Hirano et al. | 257/778 |
| 5,803,340 A | 9/1998 | Yeh et al. | 228/56.3 |
| 5,804,771 A | 9/1998 | McMahon et al. | 174/255 |
| 5,808,360 A | 9/1998 | Akram | 257/738 |
| 5,811,879 A | 9/1998 | Akram | 257/723 |
| 5,817,541 A | 10/1998 | Averkiou et al. | 438/107 |
| 5,822,856 A | 10/1998 | Bhatt et al. | 29/832 |
| 5,834,844 A * | 11/1998 | Akagawa et al. | 257/734 |
| 5,861,666 A | 1/1999 | Bellaar | 257/686 |
| 5,863,816 A | 1/1999 | Cho | 438/123 |
| 5,870,289 A | 2/1999 | Tokuda et al. | 361/779 |
| 5,883,435 A | 3/1999 | Geffken et al. | 257/758 |
| 5,925,931 A | 7/1999 | Yamamoto | 257/737 |
| 5,994,222 A | 11/1999 | Smith et al. | 438/689 |
| 6,012,224 A | 1/2000 | DiStefano et al. | 29/840 |
| 6,013,877 A | 1/2000 | Degani et al. | 174/264 |
| 6,018,196 A | 1/2000 | Noddin | 257/777 |
| 6,020,561 A | 2/2000 | Ishida et al. | 174/261 |
| 6,037,665 A * | 3/2000 | Miyazaki | 257/773 |
| 6,040,630 A * | 3/2000 | Panchou et al. | 257/783 |
| 6,046,909 A | 4/2000 | Joy | 361/748 |
| 6,084,297 A | 6/2000 | Brooks et al. | 257/698 |
| 6,084,781 A | 7/2000 | Klein | 361/771 |
| 6,087,597 A * | 7/2000 | Shimada et al. | 174/263 |
| 6,103,552 A | 8/2000 | Lin | 438/113 |
| 6,103,992 A | 8/2000 | Noddin | 219/121.71 |
| 6,127,204 A | 10/2000 | Isaacs et al. | 438/106 |
| 6,187,615 B1 * | 2/2001 | Kim et al. | 438/113 |
| 6,287,893 B1 * | 9/2001 | Elenius et al. | 438/108 |

OTHER PUBLICATIONS

Elenius, "Choosing a Flip Chip Bumping Supplier—Technology an IC Package contractor should look for," Advanced Packaging, Mar./Apr. 1998, pp. 70–73.

Erickson, "Wafer Bumping: The Missing Link for DCA," Electronic Packaging & Production, Jul. 1998, pp. 43–46.

Kuchenmeister et al., "Film Chip Interconnection Systems Prepared By Wet Chemical Metallization," IEEE publication 0–7803–4526–6/98, Jun. 1998, 5 pages.

Ghaffarian, "Long Time BGA Assembly Reliability," Advancing Microelectronics, vol. 25, No. 6, Sep./Oct. 1998, pp. 20–23.

U.S. application Ser. No. 09/120,408, filed Jul. 22, 1998, entitled "Flip Chip Assembly With Via Interconnection".

U.S. application Ser. No. 09/464,562, filed Dec. 16, 1999, entitled "Bumpless Flip Chip Assembly With Strips And Via–Fill".

U.S. application Ser. No. 09/464,561, filed Dec. 16, 1999, entitled "Bumpless Flip Chip Assembly With Strips–In–Via And Plating".

* cited by examiner

BUMPLESS FLIP CHIP ASSEMBLY WITH SOLDER VIA

CROSS-REFERENCE TO RELATED APPLICATIONS

The present application is divisional of U.S. application Ser. No. 09/465,024 filed on Dec. 16, 1999, which is an application filed in accordance with 35 U.S.C. §119 and claims the benefit of earlier filed Singapore application number 9804817-6 filed on Dec. 17, 1998.

FIELD OF THE INVENTION

This invention relates generally to a semiconductor device assembly, and in particular, relates to a connection of integrated circuit (IC) chip or chips to substrate circuitry, printed circuit board, and interconnect components.

BACKGROUND OF THE INVENTION

Recent developments of semiconductor packaging suggest an increasingly critical role of the technology. New demands are coming from requirements for more leads per chip and hence smaller input/output terminal pad pitch, shrinking die and package footprints, and higher operational frequencies that generate more heat, thus requiring advanced heat dissipation designs. All of these considerations must be met and, as usual, placed in addition to the cost that packaging adds to the overall semiconductor manufacturing costs.

Conventionally, there are three predominant chip-level connection technologies in use for integrated circuits, namely wire bonding, tape automated bonding (TAB) and flip chip (FC) to electrically or mechanically connect integrated circuits to leadframe or substrate circuitry. Wire bonding has been the far most broadly applied technique in the semiconductor industry because of its maturity and cost effectiveness. However, this process can be performed only one wire bond at a time between the semiconductor chip's bonding pads and the appropriate interconnect points. Furthermore, because of the ever increasing operational frequency of the device, the length of the interconnects needs to be shorter to minimize inductive noise in power and ground, and also to minimize crosstalk between the signal leads. An example of such a method is disclosed in U.S. Pat. No. 5,397,921 issued to Karnezos.

Flip chip technology is characterized by mounting of the unpackaged semiconductor chip with the active side facing down to an interconnect substrate through contact anchors such as solder, gold or organic conductive adhesive bumps. The major advantage of flip chip technology is the short interconnects which can, therefore, handle high speed or high frequency signals. There are essentially no parasitic elements, such as inductance. Not only is the signal propagation delay slashed, but much of the waveform distortion is also eliminated. Flip chip also allows an array interconnecting layout that provides more I/O than a perimeter interconnect with the same die size. Furthermore, it requires minimal mounting area and weight which results in overall cost saving since no extra packaging and less circuit board space is used. An example of such a method is disclosed in U.S. Pat. No. 5,261,593 issued to Casson et al.

While flip chip technology has tremendous advantages over wire bonding, its cost and technical limitations are significant. First of all, prior art flip chip technology must confront the challenge of having to form protruded contact anchors or bumps to serve as electrical connections between the integrated circuit chip and substrate circuitry. Examples of such an approach are disclosed in U.S. Pat. No. 5,803,340 issued to Yeh et al. and U.S. Pat. No. 5,736,456 issued to Akram. These approaches typically include a very costly vacuum process to deposit an intermediate under-bump layer that serves as an adhesive and diffusion barrier. This barrier layer is typically composed of a film stack that can be in the structure of chromium/copper/gold. Bumping materials such as solder are subsequently deposited onto this intermediate layer through evaporation, sputtering, electroplating, solder jetting or paste printing methods followed by a reflow step to form the solder contacts. Although evaporation and sputtering can potentially offer high density bumps, these processes need very tight control and normally result in poor yield. As a result, a conventional flip chip assembly is not only very costly but also suffers from very serious reliability problems and a high fatality ratio.

Techniques for fabricating the intermediate under-bump barrier layer as well as the bump material utilizing electroless plating are also known in the prior art. An example of such a method is described in the U.S. Pat. No. 5,583,073 issued to Lin et al. Although the electroless technique provides an economical, simple and effective method for providing an under-bump barrier layer, contacting material such as solder or adhesive is still required for assembling. Solder dipping or screen printing of solder paste onto these bumps has been explored but has been met with very limited success due to lack of solder bridging control and non-uniform deposition of solder on the metal bumps. This process also suffers from poor process control as input/output terminal pad spacing gets smaller.

In view of the limitations of currently available integrated circuit assembling methods, a high performance, reliable and economical device and method that can effectively interconnect integrated circuits to the external circuitry would be greatly desirable.

SUMMARY OF THE INVENTION

It is therefore an object of the present invention to provide a flip chip assembly to address high density, low cost and high performance requirements of semiconductor packaging. The device and method of the present invention involve the bonding of substrate circuitry to a semiconductor device through the reflowing of pre-deposited solder to connect via apertures or holes of the substrate to terminal pads of the semiconductor device without the need for conventional bumps, bonding wire, or other media.

More specifically, the present invention relates to a chip assembly that includes a single or multi-layered substrate of which circuitry is connected to the input/output terminal pads of the IC chip through solder reflow in the via holes. The solder deposition techniques include electrolytic plating, electroless (chemical) plating, wave soldering, meniscus coating and solder printing.

In summary, using soldering material directly reflowed between a via hole and a terminal pad can effectively connect an IC chip and dielectric substrate circuitry without external bumps or wires. This approach allows a reliable, low profile, high performance and low cost assembly to be achieved. In particular, a small via hole formed by laser drilling or other techniques allows a very fine pitch terminal pad to be interconnected, which can significantly enhance the capability of packaging future high I/O semiconductor chips.

DETAILED DESCRIPTION OF THE INVENTION

Figure 1A:
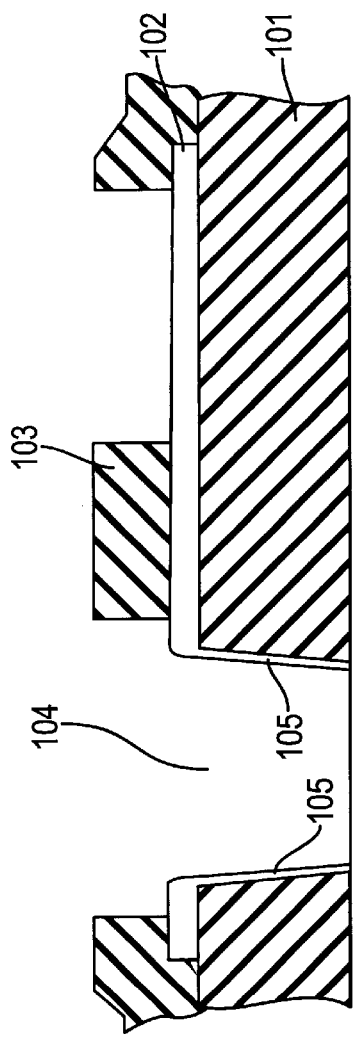
FIG. 1A is a fragmented partial sectional side elevational view of a substrate before plating the via hole with solder.

The bumpless flip chip assembly of the present invention includes a rigid or flexible dielectric substrate having a plurality of electrically conductive circuitry traces and a plurality of via apertures or holes. The conductive traces on the surface of the substrate extend into the via holes through the conductive material deposited on the via hole walls. This plated through-hole (PTH) material such as plated copper, gold, nickel, titanium or palladium provides a conductive base for solder deposition or solder wetting. Soldering material such as tin-lead alloy or lead-free solder is pre-deposited in the via hole or on the terminal pad. This readily available solder serves as the joint material after the substrate is attached to the semiconductor chip. The orientation of the attachment between the chip and substrate circuitry ensures that at least one of the via holes in the dielectric substrate is aligned with a terminal pad.

After alignment, the IC chip is brought in contact with the dielectric substrate through an adhesive film or paste, or mechanical techniques such as mechanical clamping. This soft or proximity contact ensures that the pre-deposited soldering material is able to reflow into the via hole as well as onto the terminal pad when it is molten. Heat, which serves to activate the flux and bring the solder to its melting point, is used to effect the metallurgical bonding. This re-flow process results in a solder joint which electrically and physically connects the via hole and IC pad. This not only assures a very cost effective and simple process, but also provides a compliant joint with significant stress release which results in a very reliable connection between the substrate circuitry and IC chip.

As defined herein, the preferred embodiment is particularly directed to the bonding of an integrated circuit (IC) chip to a flexible circuitized substrate, or to a more rigid, circuitized substrate, a particular example of the latter being a printed circuit board. It is to be understood, however, that the invention is not limited to the attachment to printed circuit boards, in that other circuitized substrates, including known plastic and ceramic substrates, may be employed. Typically, an organic-type substrate is preferable for lower cost and superior dielectric property whereas an inorganic-type substrate is preferable when high thermal dissipation and matched coefficient of expansion are desired. The term "substrate" as used herein is defined as at least one layer of dielectric material having at least one conductive layer thereon. Printed circuit boards of similar type are well known in the electronics industry, as well as the processes for making the same, and therefore, further definition is not believed to be necessary. Such structures may include many more electrically conductive layers than those depicted in FIGS. 1A through 1E, depending on the desired operational characteristics. As is known, such electrically conductive layers may function as signal, power, and/or ground layers.

In one embodiment of the invention, the solder pre-deposition is in the via hole. In this embodiment, the via holes are first metallized with a base metal by a conventional plated through hole (PTH) technique followed by solder deposition. Solder deposition techniques include electroplating, electroless plating, wave soldering, meniscus solder coating, solder paste printing and dispensing to accomplish the pre-coating of solder material onto the metallized hole wall. It is understood that the particular solder or solder paste and methods of dispensing depicted herein are not meant to limit the invention.

In another embodiment of the invention, the solder pre-deposition is on the IC terminal pad. In this method, a barrier layer over-coated on an aluminum pad before solder deposition is preferred. This is to provide a good solder wetting surface and protect the aluminum surface against leaching, oxidation or degradation resulting from heat and soldering contact. This coating can be accomplished by sputtering a stake of thin film or by wet chemical direct plating of electroless nickel and immersion gold. For copper terminal pads, the pre-treatment may not be necessary when the surface is free of oxide and contamination.

The via holes of the substrate can be formed by various techniques including mechanical drilling, punching, plasma etching or laser drilling. They are formed in the substrate before or after the circuitry patterning depending on the various fabrication processes. The via holes are formed at locations that can be aligned with and expose input/output terminal pads of the semiconductor chip or chips that are subsequently mounted on the side of the substrate opposite the side where the electrical circuitry is formed.

A preferred application of heat to reflow pre-deposited solder is by a convection oven. Alternatively, the heat may be applied by a laser to effect solder reflow and bonding to the IC terminal pads which are in the vicinity of the via holes. Another example of such an approach is an infrared (IR) continuous belt reflow oven. Alternatively, hot nitrogen gas may be directed onto the solder members of the assembly. It is understood that the particular re-flow techniques depicted above are not meant to limit the invention, in that it is also possible to reflow the solder using a vapor phase reflow system.

If the finished product is, for instance, a ball grid array package, solder balls will normally be placed on the specific traces on the surface of the dielectric substrate. This finished package can be connected to a printed circuit board by reflowing the solder balls to form an attachment to the conductors of the printed circuit board.

FIGS. 1A to 1E are diagrammatic cross-sectional views showing steps involved in the manufacturing of an integrated circuit assembly by pre-depositing solder in the substrate via hole and re-flowing the solder to connect the terminal pad.

Referring initially to FIG. 1A, a substrate 101 having a plurality of electrically conductive circuitry traces 102 partially covered by the solder mask 103 is shown. The traces 102 on the substrate 101 extend into a plurality of via holes 104 by a thin layer of plated through-hole copper 105 deposited on the via hole walls.

Figure 1B:
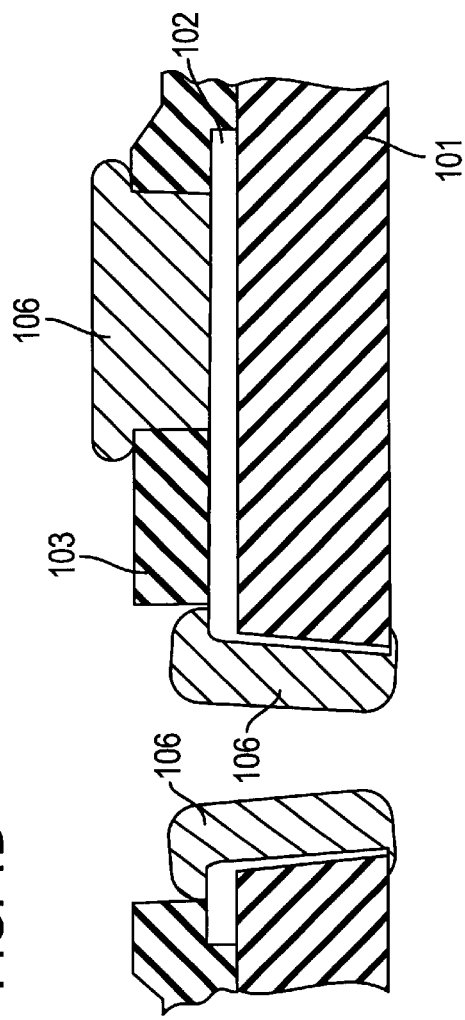
FIG. 1B is a fragmented partial sectional side elevational view of the substrate of the type shown in FIG. 1A after plating the via hole with solder.

FIG. 1B shows the substrate 101 immersed in a solder plating solution and a layer of solder 106 is electroplated on the metallized via hole wall as well as on the solder opening site.

Figure 1C:
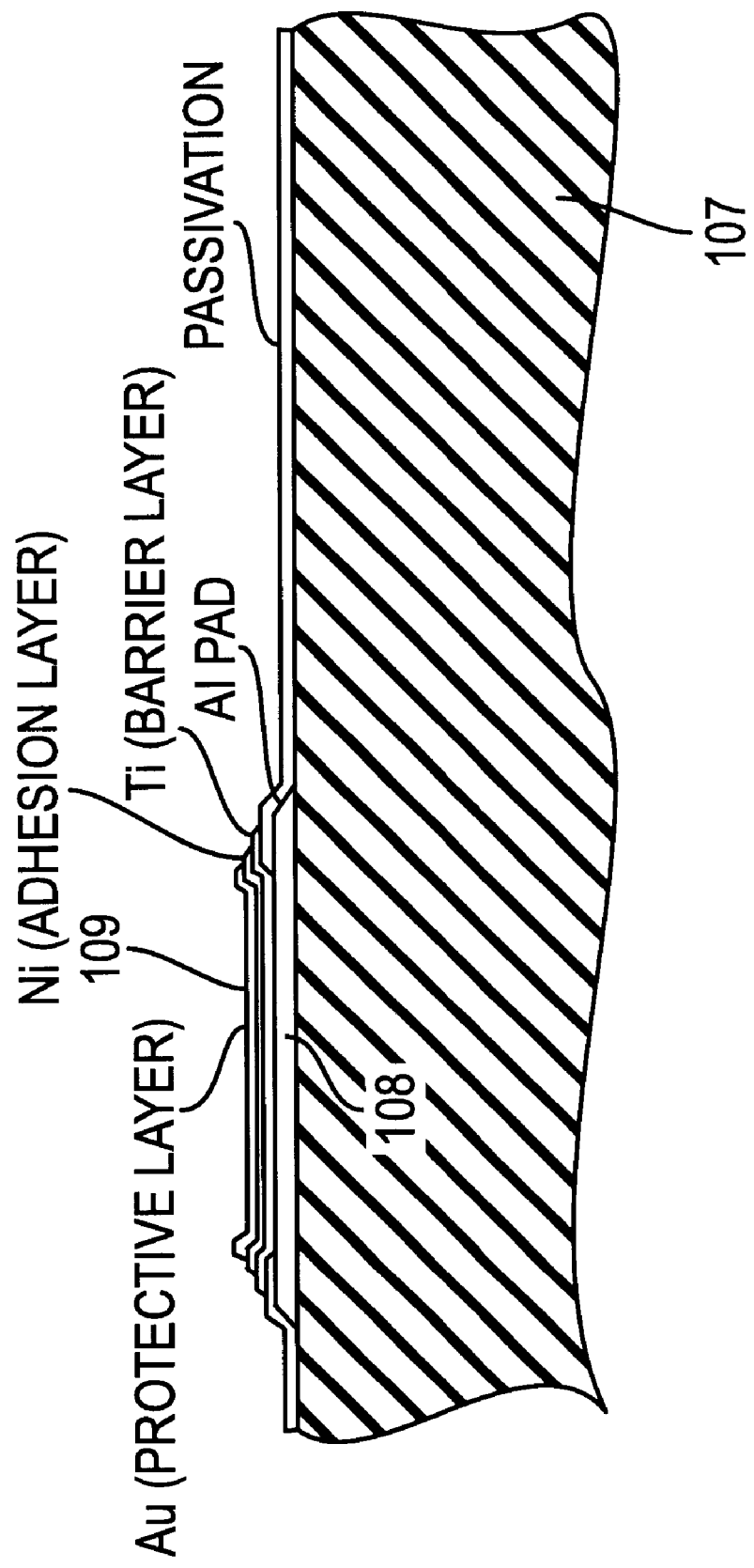
FIG. 1C is a fragmented partial sectional side elevational view of a semiconductor chip having a terminal pad.

FIG. 1C shows an integrated circuit chip 107 having various types of transistors, wires and the like (not shown), which has a plurality of exposed input/output terminal pads 108. These pads 108 are formed with a stake of thin film 109 in the structure of titanium (500 Angstroms)/nickel (700 Angstroms)/gold (1000 Angstroms) to serve as the barrier and adhesive layer. Passivation is disposed on chip 107 outside pads 108.

Figure 1D:
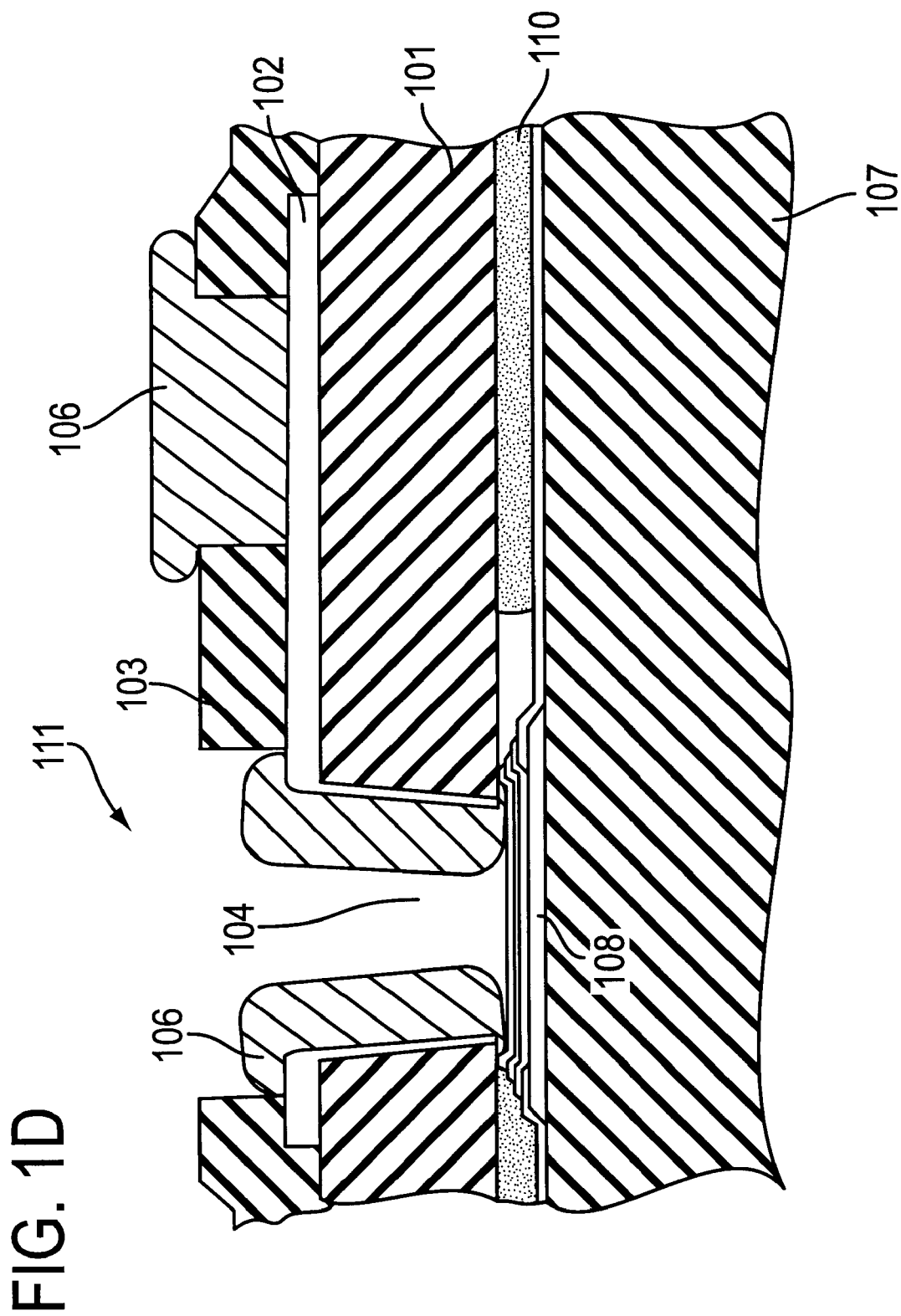
FIG. 1D is a fragmented partial sectional side elevational view of a chip assembly after a semiconductor chip of the type shown in FIG. 1C has been attached to a substrate of the type shown in FIG. 1B.

FIG. 1D shows IC chip 107 securely attached to the substrate 101 by adhesive paste ABLESTIK "ABLEBOND 961-2" 110 to form an assembly 111. The orientation of the attachment is arranged in such a manner that a specific terminal pad 108 of the integrated circuit chip 107 is in contact with the solder 106 inside a specific via hole 104. The via hole 104 serves as an electrically connecting channel for the respective trace 102 of the substrate 101.

Figure 1E:
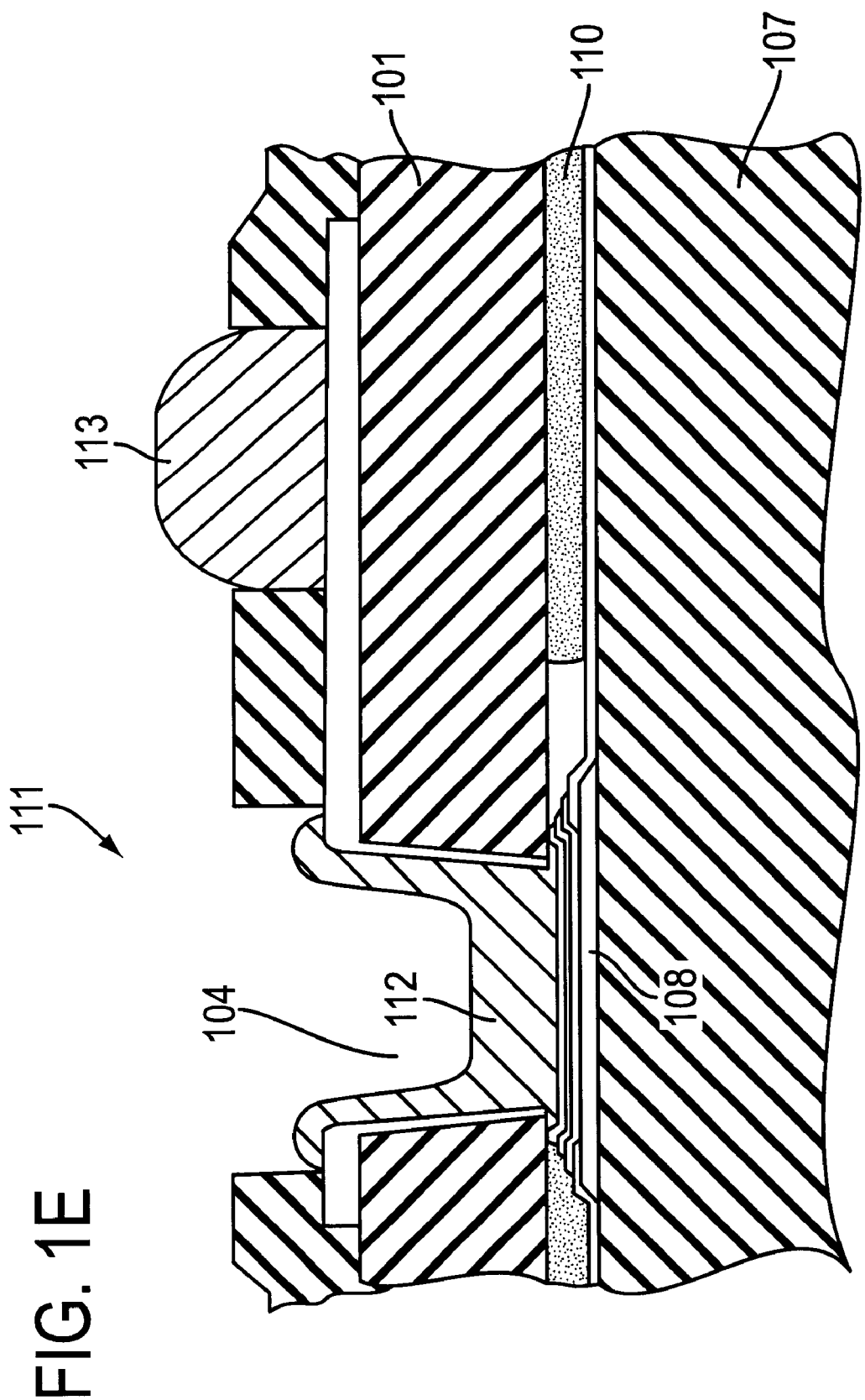
FIG. 1E is a fragmented partial sectional side elevational view of the chip assembly of the type shown in FIG. 1D after a solder reflow process.

FIG. 1E shows the input/output terminal pad 108 firmly joined together with a specific via hole 104 by solder joint 112 to become an integral part after the assembly 111 is placed in an oven that causes solder 106 to reflow. This simultaneously-reflowed joint 112 provides an effective electrical and mechanical connection between IC chip 107 and substrate 101. The soldering material 113 deposited in the solder mask opening serves as the contacting material for the next level assembly.

Though only one integrated circuit chip 107 is shown, it is to be understood that additional integrated circuit chips, as well as passive components such as resistors or capacitors, can also be mounted on the substrate 101.

Likewise, it is to be understood that many solder systems including lead-free ones can also be applied and serve the connection purpose.

The present invention may be embodied in other specific forms without departing from the spirit or essential characteristics thereof. The presently disclosed embodiments are, therefore, to be considered in all respects as illustrative and not restrictive, the scope of the invention being indicated by the appended claims and all changes which come within the meaning and range of equivalency of the claims are, therefore, to be embraced therein.

What is claimed is:

1. A flip chip assembly, comprising:
   a semiconductor chip that includes a terminal pad;
   a substrate that includes a dielectric layer and metallization, wherein the dielectric layer includes first and second surfaces that are opposite one another and a via hole that extends between the first and second surfaces, the first surface faces away from the chip, the second surface faces towards the chip, the metallization is disposed on sidewalls of the via hole and extends along the sidewalls to the first and second surfaces and is spaced from the pad, and the via hole is aligned with the pad; and
   a solder joint in the via hole that contacts and electrically connects the metallization and the pad.

2. The flip chip assembly as recited in claim 1, wherein the pad is directly beneath substantially all surface area defined by the via hole.

3. The flip chip assembly as recited in claim 1, wherein the metallization is electrolessly plated on the sidewalls.

4. The flip chip assembly as recited in claim 1, wherein the metallization is aligned with the second surface.

5. The flip chip assembly as recited in claim 1, wherein the metallization and the solder joint are the only materials in the via hole.

6. The flip chip assembly as recited in claim 1, wherein substantially all of the solder joint is within the via hole.

7. The flip chip assembly as recited in claim 1, wherein the solder joint fills a bottom portion of the via hole without filling a top portion of the via hole.

8. The flip chip assembly as recited in claim 1, wherein the solder joint has a bowl-like shape.

9. The flip chip assembly as recited in claim 1, wherein the solder joint is electroplated on the metallization without being electroplated on the pad.

10. The flip chip assembly as recited in claim 1, wherein the substrate includes a conductive trace disposed on the first surface and the metallization contacts the conductive trace proximate to a corner between the first surface and the via hole.

11. A flip chip assembly, comprising:
    a semiconductor chip that includes a terminal pad;
    a substrate that includes a dielectric layer and metallization, wherein the dielectric layer includes first and second surfaces that are opposite one another and a via hole that extends between the first and second surfaces, the first surface faces away from the chip, the second surface faces towards the chip, the metallization is disposed on sidewalls of the via hole and extends along the sidewalls to the first and second surfaces, and the via hole is aligned with the pad;
    an adhesive between and in contact with the second surface and the chip; and
    a solder joint in the via hole that contacts and electrically connects the metallization and the pad.

12. The flip chip assembly as recited in claim 11, wherein the pad is directly beneath substantially all surface area defined by the via hole.

13. The flip chip assembly as recited in claim 11, wherein the metallization is electrolessly plated on the sidewalls.

14. The flip chip assembly as recited in claim 11, wherein the metallization is aligned with the second surface.

15. The flip chip assembly as recited in claim 11, wherein the metallization and the solder joint are the only materials in the via hole.

16. The flip chip assembly as recited in claim 11, wherein substantially all of the solder joint is within the via hole.

17. The flip chip assembly as recited in claim 11, wherein the solder joint fills a bottom portion of the via hole without filling a top portion of the via hole.

18. The flip chip assembly as recited in claim 11, wherein the solder joint has a bowl-like shape.

19. The flip chip assembly as recited in claim 11, wherein the solder joint is electroplated on the metallization without being electroplated on the pad.

20. The flip chip assembly as recited in claim 11, wherein the substrate includes a conductive trace disposed on the first surface and the metallization contacts the conductive trace proximate to a corner between the first surface and the via hole.

21. The flip chip assembly as recited in claim 1, wherein an adhesive is between the substrate and the chip and mechanically attaches the substrate and the chip without electrically connecting the substrate and the chip.

22. The flip chip assembly as recited in claim 1, wherein an adhesive contacts and mechanically attaches the substrate and the chip without electrically connecting the substrate and the chip.

23. The flip chip assembly as recited in claim 1, wherein the pad is a bumpless pad.

24. The flip chip assembly as recited in claim 1, wherein the pad is a solder-free pad.

25. The flip chip assembly as recited in claim 1, wherein the pad is a bumpless solder-free pad.

26. The flip chip assembly as recited in claim 11, wherein the adhesive mechanically attaches the substrate and the chip without electrically connecting the substrate and the chip.

27. The flip chip assembly as recited in claim 11, wherein the adhesive is spaced from the solder joint.

28. The flip chip assembly as recited in claim 11, wherein the pad is a bumpless pad.

29. The flip chip assembly as recited in claim 11, wherein the pad is a solder-free pad.

30. The flip chip assembly as recited in claim 11, wherein the pad is a bumpless solder-free pad.

31. The flip chip assembly as recited in claim 1, wherein the solder joint extends continuously between the first and second surfaces in the via hole.

32. The flip chip assembly as recited in claim 1, wherein the solder joint is the only material in the via hole that contacts the metallization.

33. The flip chip assembly as recited in claim 1, wherein the solder joint is the only material in the via hole that contacts the pad.

34. The flip chip assembly as recited in claim 1, wherein the solder joint is the only material that contacts the metallization and the pad.

35. The flip chip assembly as recited in claim 1, wherein the solder joint is the only conductor external to the chip that contacts the pad.

36. The flip chip assembly as recited in claim 11, wherein the solder joint extends continuously between the first and second surfaces in the via hole.

37. The flip chip assembly as recited in claim 11, wherein the solder joint is the only material in the via hole that contacts the metallization.

38. The flip chip assembly as recited in claim 11, wherein the solder joint is the only material in the via hole that contacts the pad.

39. The flip chip assembly as recited in claim 11, wherein the solder joint is the only material that contacts the metallization and the pad.

40. The flip chip assembly as recited in claim 11, wherein the solder joint is the only conductor external to the chip that contacts the pad.

* * * * *